United States Patent [19]
Harris et al.

[11] Patent Number: 5,322,591
[45] Date of Patent: Jun. 21, 1994

[54] HYDROTHERMAL GROWTH ON NON-LINEAR OPTICAL CRYSTALS

[75] Inventors: Meckie T. Harris, Nashua, N.H.; J. Emery Cormier, Concord, Mass.; John J. Larkin, Boston, Mass.; Alton F. Armington, Lexington, Mass.

[73] Assignee: The United States of America as represented by the Secretary of the Air Force, Washington, D.C.

[21] Appl. No.: 676,773

[22] Filed: Mar. 26, 1991

[51] Int. Cl.⁵ .............................................. C30B 15/24
[52] U.S. Cl. .................................. 117/71; 117/902; 117/942
[58] Field of Search ............... 156/617.1, 619.1, 620.4, 156/620.5, 623 R, DIG. 79; 422/249

[56] References Cited

U.S. PATENT DOCUMENTS

| | | | |
|---|---|---|---|
| 4,077,832 | 3/1978 | Robertson et al. | 156/DIG. 79 |
| 4,187,139 | 2/1980 | Brice et al. | 156/DIG. 79 |
| 4,687,538 | 8/1987 | Pastor | 156/616.4 |
| 4,724,038 | 2/1988 | Pastor et al. | 156/617.1 |
| 4,944,834 | 7/1990 | Tada et al. | 156/620.5 |

OTHER PUBLICATIONS

Litvin et al., Synthesis and Electrooptic Properties of Single Si-Sillentie Crystals, Soviet Physics-Crystallography, vol. 13, No. 6, Jun. 1969, pp. 971-973.

"Optical Properties of Sillenite-Type Single Crystals"; Meisner et al; *Soviet Physics-Crystallography*; vol. 15, No. 6 May-Jun. 1971.

"Crystal Growth and Electro-Optic Effect of Bismuth Germanate, $Bi_4(GeO_4)^3$"; Nitsche; *Journal Applied Physics*; vol. 36, No. 8, Aug. 1965.

*Primary Examiner*—Olik Chaudhuri
*Assistant Examiner*—Felisa Garrett
*Attorney, Agent, or Firm*—Stanton E. Collier; Donald J. Singer

[57] ABSTRACT

The growth of bismuth silicate crystals occurs in a high pressure vessel or autoclave using a hydrothermal growth process. The nutrient material is placed in a sealed container of noble metal, liner, along with a solvent to a selected fill level. A filler fluid is also placed between the liner and the pressure vessel. The oriented seeds are placed in the cooler top seed zone over a baffle that slows the movement of supersaturated liquid from the hotter lower nutrient zone. Using a selected heating schedule for the top and the bottom zones, a plurality of large crystals are grown in the seed zone. The temperature differential is about 5° C.

10 Claims, 2 Drawing Sheets

HYDROTHERMAL GROWTH ON NON-LINEAR OPTICAL CRYSTALS

STATEMENT OF GOVERNMENT INTEREST

The invention described herein may be manufactured and used by or for the Government for governmental purposes without the payment of any royalty thereon.

BACKGROUND OF THE INVENTION

The present invention relates to non-linear optical materials, and, in particular, to the growth of these materials, and, more particularly, to the hydrothermal growth of non-linear optical crystals.

Non-linear optical materials such as bismuth silicate may be used in optical memories and for optical signal processing. Bismuth silicate is especially desirable since it operates at higher speeds than other available non-linear optical materials.

Single crystals have conventionally been grown from a melt by using the floating zone technique, the Bridgman technique or the Czochralski technique. If a crystal is grown from a melt, the composition of the crystal is a function of the composition of the melt and of the growth conditions. Variations of the growth rate, for example, cause variations in the composition along the length of the crystal, but it is difficult to avoid all changes in growth rate. For many applications it is desirable that the composition of a single crystal should be substantially constant along the length of the crystal, both on account of the greater tendency of non-homogeneous crystals to crack during cutting or polishing operations and for the requirement of producing crystal elements having physical properties within narrow ranges of values.

Using the Czochralski growth technique a crystal is pulled from a melt of the same material. An oriented seed is dipped into the melt and slowly raised in such a way that the molten material freezes on the bottom of the seed due to the lower temperature as it is raised into the air above the molten material. The higher thermal conductivity of the solid also helps lower the temperature at the molten interface which aids in the freezing of the crystal. This is the most used crystal growth process and is particularly useful for crystals composed of a single element such as silicon. The quality of bismuth silicate crystals grown by this technique is marginal at best. The stoichiometry may not be satisfactory and certain impurities are introduced into the grown crystal which cause undesirable coloring of the crystal. A growth temperature related defect influences the "instrinsic" color and thus the non-linear optical properties. Internal strain in conventional crystals is evidenced under crossed polarizers. In addition, the reproducibility between runs is poor which means that each crystal must be separately evaluated for its optical properties prior to its application.

Until now, it has only been possible to grow bismuth silicate directly from the melt using the Czochralski technique or a variation of this technique called "top seeded solution growth" where a solvent is added to the molten solution which lowers the melting point of the melt making it possible to grow at a lower temperature. The reproducibility between runs is poor by either of these techniques which requires that each crystal be evaluated optically.

SUMMARY OF THE INVENTION

The present invention provides a method of growing non-linear optical materials such as bismuth silicate with high optical quality, high uniformity between runs and in bulk amounts.

The growth of bismuth silicate crystals occurs in a high pressure vessel or autoclave using a hydrothermal growth process. The nutrient material is placed in a sealed container, liner, along with a solvent to a selected fill level. A filler fluid is also placed between the liner and the pressure vessel. The oriented seeds are placed in the cooler top seed zone over a baffle that slows the movement of supersaturated liquid -from the hotter lower nutrient zone. Using a selected heating schedule for the top and the bottom zones, a plurality of large crystals are grown in the seed zone.

Therefore, one object of the present invention is a method of growing non-linear optical materials using the hydrothermal method.

Another object of the present invention is to grow non-linear optical single crystals in a hydrothermal method.

Another object of the present invention is to provide a method of growing bismuth silicate crystals.

Another object of the present invention is to provide a method of growing bismuth silicate crystals of high optical quality and high uniformity between different runs.

Another object of the present invention is a method of growing other non-linear optical materials such as bismuth germanate, bismuth titanate, etc.

Another object of the present invention is to reduce undesireable impurities such as those which cause permanent color changes in the photochromic effect.

Another object of the present invention is to reduce the growth temperature, reducing defects and yielding material which can be "tailored" to specific applications using suitable dopants.

Another object of the present invention is to reduce strain in these crystals.

These and many other objects and advantages of the present invention will be readily apparent to one skilled in the pertinent art from the following detailed description of a preferred embodiment of the invention and the related drawings.

DESCRIPTION OF THE PREFERRED EMBODIMENT

Figure 1A:
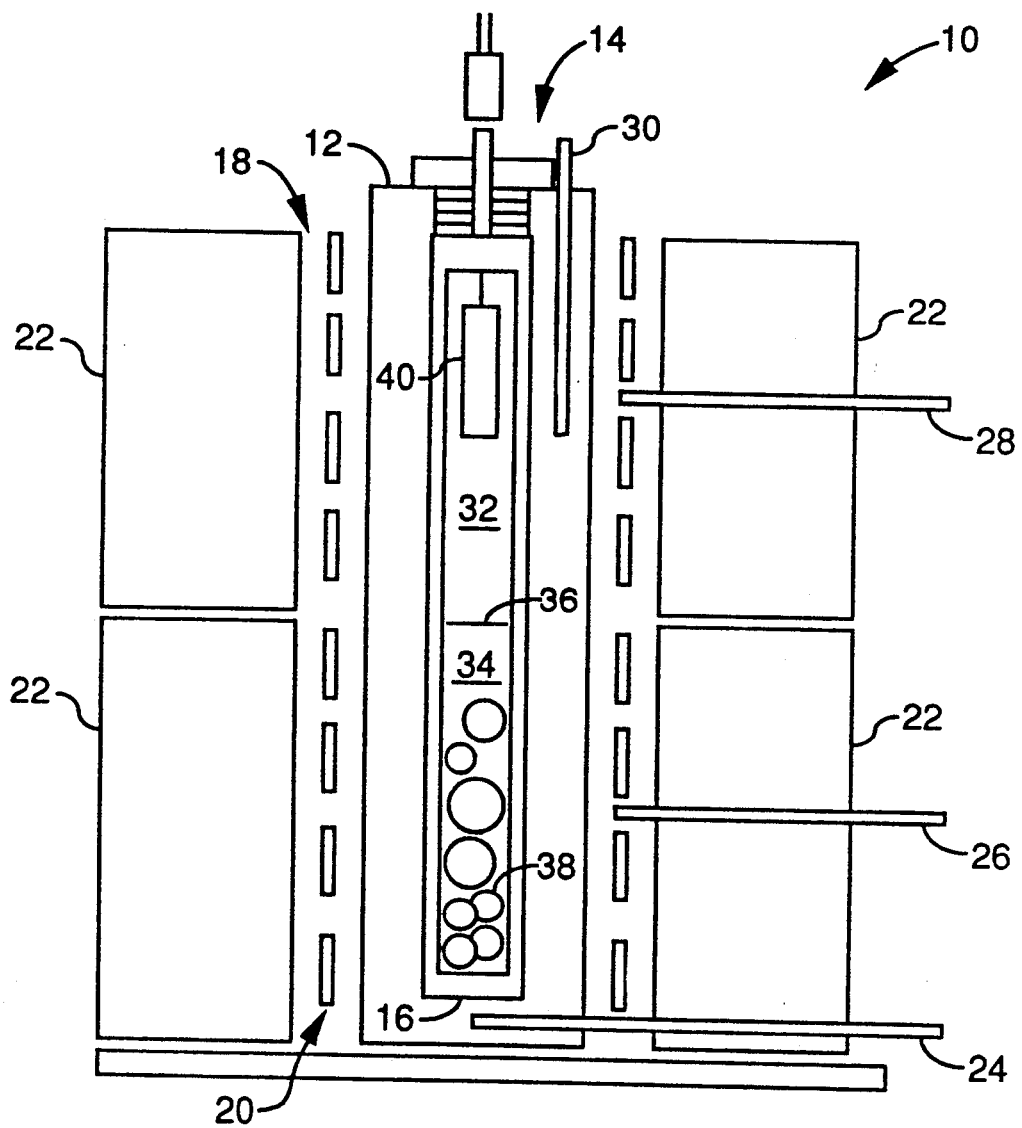
FIGS. 1A and 1B illustrate the high pressure vessel used in the present invention.
Figure 1B:
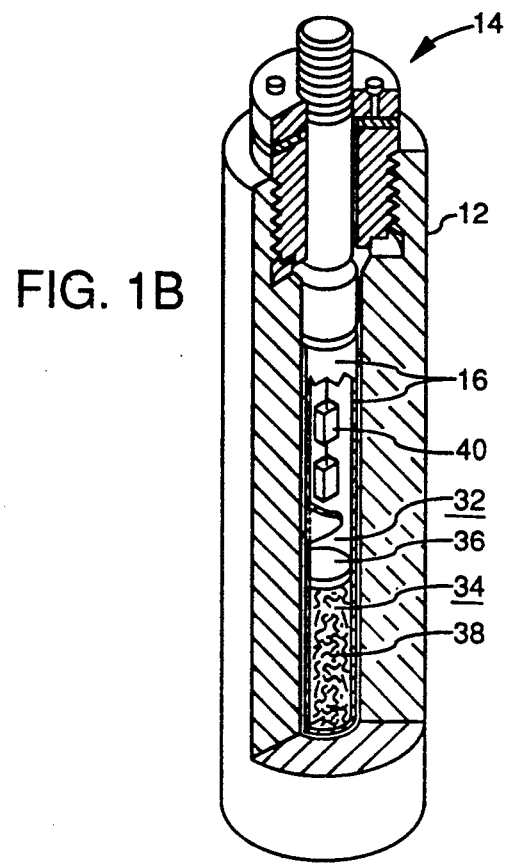

Hydrothermal crystal growth is performed in a high pressure vessel or autoclave 10 as shown in FIGS. 1A and 1B.

A pressure vessel 12 being made of forged steel is capable of withstanding internal pressures of at least 1000 atmospheres. The top of the vessel 12 can be sealed with a Bridgman seal assembly 14. The seal assembly 14 holds the pressure due to expansion of the seal against the inside of the top of the autoclave 10 during mechanical assembly and is reinforced by the pressure created by the expansion of the solution caused during the heating up cycle prior to growth.

The crystal growth occurs inside a sealed liner 16 made of a noble metal to protect the vessel 12. About the vessel 12 are upper zone heaters 18 and lower zone heaters 20 with insulation 22 about the heaters. The temperature is monitored by a lower control thermocouple 24, a lower surface thermocouple 26, an upper surface thermocouple 28, and an upper control thermocouple 30.

Inside the sealed liner 16 is a seed zone 32 and a nutrient zone 34 with a baffle 36 therebetween.

This sealed vessel 12 contains a nutrient 38 in the bottom which is the hottest zone during growth. A seed 40, one or more, is attached in the seed zone 32 which is cooler during growth. The baffle 36 between the zones 32 and 34 controls the flow of supersaturated fluid therebetween. A solvent is placed in the sealed liner 16; the amount, the percent fill, determines the pressure in the vessel 12 since it expands to fill the autoclave 10. Fluid is also added between the vessel 12 and the liner 16 to equalize pressure.

The seeds 40 were produced from Czochralski grown crystals having, a preferred orientation of 100 or 110. The nutrient 38 may be bismuth silicate crystals grown by the Czochralski technique, cast material, or material from a prior hydrothermal run. Additional silicon dioxide or bismuth oxide may be added to optimize the grown crystals.

Figure 2:
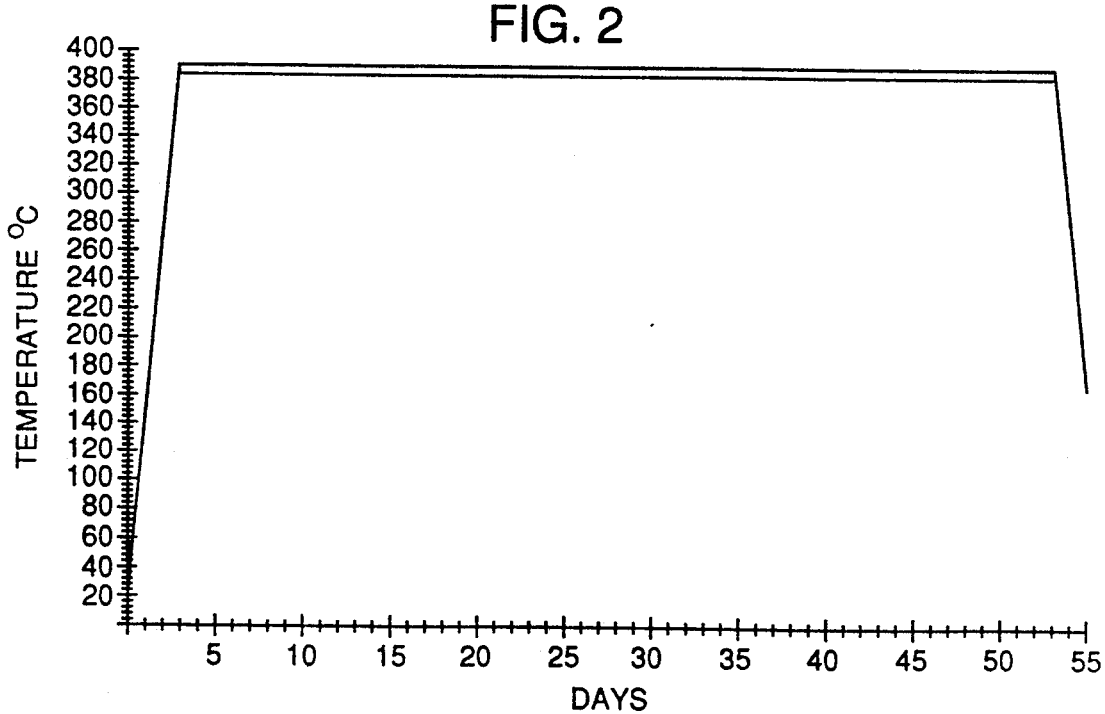
FIG. 2 illustrates by graph the temperature schedule used in the high pressure vessel of FIGS. 1A and 1B.

The upper and lower zones 32 and 34 are slowly heated to their desired temperatures over a period of 48 hours under computer control according to a heat schedule as illustrated in FIG. 2. The temperature of the lower zone 34 is then set to the desired temperature. Temperatures between 365 and 400 degrees centigrade have been employed with the most satisfactory temperature being 390 degrees centigrade. Below this temperature little growth occurs. Above this temperature, growth tends to be too rapid resulting in the formation of poor crystals. The gradient for the thermal convection and production of a supersaturated solution is set by having a lower temperature in the upper crystal growth zone 32. Gradients from 2 to 20 degrees centigrade have been employed with best results obtained using a 5 degree centigrade difference.

As has been stated above, the pressure in the vessel 12 during the growth run is controlled by the degree to which the solvent fills the residual volume of the autoclave 12. This is termed the per cent fill of the autoclave 10. The most satisfactory fill was 68 per cent and above which produced a pressure upwards of 4,000 pounds per square inch.

Both acidic and basic solvents were investigated. For the best results, a standard of 4 normal sodium hydroxide was used.

The bismuth silicate crystals produced were water clear. For example, crystals produced during a typical run are as follows:

Crystal I
Thickness: 0.343 in.
Width: 0.383 in.
Length: 0.458 in.
Net Weight: 55.44 grams

Crystal II
Thickness: 0.337 in.
Width: 0.346 in.
Length: 0.434 in.
Net Weights: 41.85 grams Crystal color ranged from colorless to green to brown depending on growth conditions. Crystals exhibited a greatly reduced tendency to change color under ambient light indicating a significant reduction in photochromic impurities. Internal strain as evidenced in crossed polarizers is reduced greatly below that of conventionally grown material.

Clearly, many modifications and variations of the present invention are possible in light of the above teachings and it is therefore understood, that within the inventive scope of the inventive concept, the invention may be practiced otherwise than specifically claimed.

What is claimed is:

1. A method of growing non-linear optical crystals, said method comprising the steps of:
    placing in a nutrient zone of a liner non-linear optical material;
    placing a baffle in the liner;
    placing at least one oriented seed in a crystal growth zone;
    filling the liner with solvent;
    sealing the liner;
    placing the liner in an autoclave;
    filling the space between the liner and the autoclave with fluid;
    sealing the autoclave;
    selectively heating the autoclave for a predetermined amount of time;
    unsealing the autoclave;
    unsealing the liner; and
    removing the non-linear optical crystals therefrom.

2. A method as defined in claim 1 wherein said non-linear optical nutrient is selected from the group consisting of Czochralski grown crystals, cast material, and non-linear crystals grown by said method.

3. A method as defined in claim 2 further including adding silicon dioxide or bismuth oxide to the nutrient zone.

4. A method as defined in claim 1 wherein said oriented seed is selected from the group consisting of 100 and 110.

5. A method as defined in claim 1 wherein said solvent is NaOH.

6. A method as defined in claim 5 wherein the concentration is about 4N.

7. A method as defined in claim 1 wherein said fill is about 0.70.

8. A method as defined in claim 1 wherein a temperature in the nutrient zone ranges from about 365° to 400° C. and the temperature differential ranges from about 2° to about 20° C.

9. A method as defined in claim 8 wherein the temperature in the nutrient zone is about 390° C. and the temperature differential is about 5° C.

10. A method as defined in claim 9 wherein crystal growth occurs from 2 hours to about 20 hours.

* * * * *